US011823914B2

(12) United States Patent
Park et al.

(10) Patent No.: US 11,823,914 B2
(45) Date of Patent: Nov. 21, 2023

(54) APPARATUS FOR TREATING SUBSTRATE

(71) Applicant: SEMES CO., LTD., Cheonan-si (KR)

(72) Inventors: Eunwoo Park, Gyeongsan-si (KR); Daesung Kim, Suwon-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 473 days.

(21) Appl. No.: 16/922,430

(22) Filed: Jul. 7, 2020

(65) Prior Publication Data
US 2021/0013058 A1    Jan. 14, 2021

(30) Foreign Application Priority Data
Jul. 8, 2019  (KR) .......................... 10-2019-0082242

(51) Int. Cl.
*H01L 21/67*  (2006.01)
*G03F 7/16*  (2006.01)
(Continued)

(52) U.S. Cl.
CPC .......... *H01L 21/67051* (2013.01); *B08B 3/04* (2013.01); *B08B 7/0071* (2013.01); *B08B 7/04* (2013.01); *G03F 7/162* (2013.01)

(58) Field of Classification Search
CPC .......... H01L 21/67051; H01L 21/6715; H01L 21/6708; H01L 21/67028; H01L 21/02057;
(Continued)

(56) References Cited

U.S. PATENT DOCUMENTS 4,838,289 A  *  6/1989  Kottman ................. G03F 7/162
                                                          134/198
5,312,487 A  *  5/1994  Akimoto ........... H01L 21/67017
                                                          118/302
(Continued)

FOREIGN PATENT DOCUMENTS

JP        2010-118519 A      5/2010
KR   10-2008-0099150 A     11/2008
(Continued)

OTHER PUBLICATIONS

Korean Office Action dated Oct. 12, 2020 issued in corresponding Korean Appln. No. 10-2019-0082242.

*Primary Examiner* — Michael E Barr
*Assistant Examiner* — Thomas Bucci
(74) *Attorney, Agent, or Firm* — Harness, Dickey & Pierce, P.L.C.

(57) ABSTRACT

An apparatus for performing heat treatment with respect to a substrate is provided. The apparatus for treating the substrate includes a substrate support member to seat a substrate on the substrate support member, a treating bowl to surround the substrate support member, a base plate provided to face a bottom surface of the substrate seated on the substrate support member, and an edge nozzle member mounted on the base plate to spray a treating liquid to a bottom edge part of the substrate seated on the substrate support member. The edge nozzle member includes a main body mounted on the base plate, a nozzle arm to mount an edge nozzle on the nozzle arm to slidably move on the main body, and a fixing member to maintain the nozzle arm at a setting position on the main body.

12 Claims, 13 Drawing Sheets

(51) Int. Cl.
*B08B 3/04* (2006.01)
*B08B 7/04* (2006.01)
*B08B 7/00* (2006.01)

(58) Field of Classification Search
CPC ......... H01L 21/67017; H01L 21/02087; H01L 21/02041; H01L 21/0209; H01L 21/0271; H01L 21/0273; G03F 7/162; B05B 13/0278; B08B 7/0071; B08B 7/04; B08B 3/04
USPC ...................................... 134/104.2
See application file for complete search history.

(56) References Cited

U.S. PATENT DOCUMENTS

| | | | | |
|---|---|---|---|---|
| 5,608,943 | A * | 3/1997 | Konishi | H01L 21/67051 15/302 |
| 9,620,394 | B2 * | 4/2017 | Kishita | B05C 11/08 |
| 2002/0152958 | A1 * | 10/2002 | Shigemori | H01L 21/67161 118/58 |
| 2004/0250839 | A1 * | 12/2004 | Robertson | G03F 7/168 134/140 |
| 2006/0102207 | A1 * | 5/2006 | Moriya | B08B 7/0035 134/184 |
| 2007/0082134 | A1 * | 4/2007 | Fukuda | G03F 7/168 427/337 |
| 2008/0280054 | A1 * | 11/2008 | Ogata | H01L 21/67051 134/33 |
| 2009/0038641 | A1 * | 2/2009 | Matsumoto | H01L 21/6708 156/345.23 |
| 2010/0200163 | A1 * | 8/2010 | Puggi | H01L 21/67051 156/345.23 |
| 2014/0251374 | A1 * | 9/2014 | Holden | H01L 21/02057 134/102.1 |
| 2014/0263481 | A1 * | 9/2014 | Lu | B05B 1/00 222/568 |
| 2017/0056936 | A1 * | 3/2017 | Nishiyama | H01L 21/68728 |
| 2019/0326152 | A1 * | 10/2019 | Ke | H01L 21/0209 |

FOREIGN PATENT DOCUMENTS

| | | |
|---|---|---|
| KR | 10-2009-0044548 A | 5/2009 |
| KR | 10-2009-0087412 A | 8/2009 |
| KR | 10-2010-0027466 A | 3/2010 |
| KR | 101017102 B1 | 2/2011 |

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2019-0082242 filed on Jul. 8, 2019, in the Korean Intellectual Property Office, the entire contents of which are hereby incorporated by reference.

BACKGROUND

Embodiments of the inventive concept relate to an apparatus for treating a substrate.

Most processes for integrated circuits are to form desired patterns at layers of a chip circuitry through a photolithography process. In this case, the photolithography process is called work of passing light through a mask having a desired pattern, which is placed on a semiconductor wafer in the manufacturing process of a semiconductor, to transfer the pattern from the mask to a photoresist.

The photolithography process uses a photoresist serving as a photochemical reaction material. The photoresist includes a negative photoresist to form a macromolecule, as chemical bonding is caused when receiving light, and a positive photoresist separated into unit molecules, as the chemical bond is broken when receiving light. In the photolithography process, the photoresist is selectively removed from the wafer by using such a characteristic of the photoresist, thereby forming a complex circuit.

In addition, to perform the photolithography process, a peripheral portion of the wafer coated with the photoresist is caught by a chuck to be carried or processed. In this case, photoresist particles are made at the position, which makes contact with the chuck or the clamp, of the wafer, which cause the failure of the following process.

To clean such photoresist particles, cleaning devices clean a top surface and a bottom surface of the wafer. In particular, a cleaning device to clean the bottom edge part of the wafer removes photoresist foreign matters from the bottom surface of the wafer remaining in the coating procedure, by performing back rinse after coating the photoresist in a coater of a track.

When foreign matters remain on the wafer, the wafer may not be uniformly baked in an oven module. In addition, an error may be caused in an exposure system or particles may be formed in the subsequently procedure. To prevent such a problem, the bottom edge nozzle sprays a solvent (thinner) to remove the photoresist from the rear surface.

However, the bottom edge nozzle of the cleaning device may not be positioned closely to the bottom edge part of the substrate due to the interference with the bottom edge nozzle when a bowl is detached.

SUMMARY

Embodiments of the inventive concept provide an apparatus for treating a substrate, capable of easily cleaning a bottom edge part of a substrate.

Embodiments of the inventive concept provide an apparatus for treating a substrate, capable of easily setting a position of an edge nozzle.

Embodiments of the inventive concept provide an apparatus for treating a substrate, capable of preventing interference with an edge nozzle in a process of attaching or detaching a treating bowl.

The objects which will be achieved in the inventive concept are not limited to the above, but other objects, which are not mentioned, will be apparently understood to those skilled in the art.

According to an exemplary embodiment, there may be provided an apparatus for treating a substrate, which includes a substrate support member to seat a substrate on the substrate support member, a treating bowl to surround the substrate support member, a base plate provided to face a bottom surface of the substrate seated on the substrate support member, and an edge nozzle member mounted on the base plate to spray a treating liquid to a bottom edge part of the substrate seated on the substrate support member. The edge nozzle member may include a main body mounted on the base plate, a nozzle arm to mount an edge nozzle on the nozzle arm to slidably move on the main body, and a fixing member to maintain the nozzle arm at a setting position on the main body.

In addition, the fixing member may include a permanent magnet.

Further, the main body may include a slide surface and a guide hole such that the nozzle arm slidably moves.

Further, the nozzle arm may include a magnetic substrate, and may include a guide pin inserted into the guide hole and a marking part to determine the setting position.

In addition, the nozzle arm may be slidably inserted into a slide surface of the main body after moved upward while rotating a predetermined angle, when the treating bowl is extracted, and the nozzle arm may be moved to the setting position appropriate to a process after the nozzle arm is exposed by sliding when the process is performed.

Further, the treating bowl may include an outer coup detachably mounted to surround the substrate support member, and an inner cup detachably mounted to surround a lower region of a substrate placed on the substrate support member. The inner cup may include a nozzle groove to position the edge nozzle of the nozzle arm, and the setting position may be a position at which the edge nozzle is inserted into the nozzle groove.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
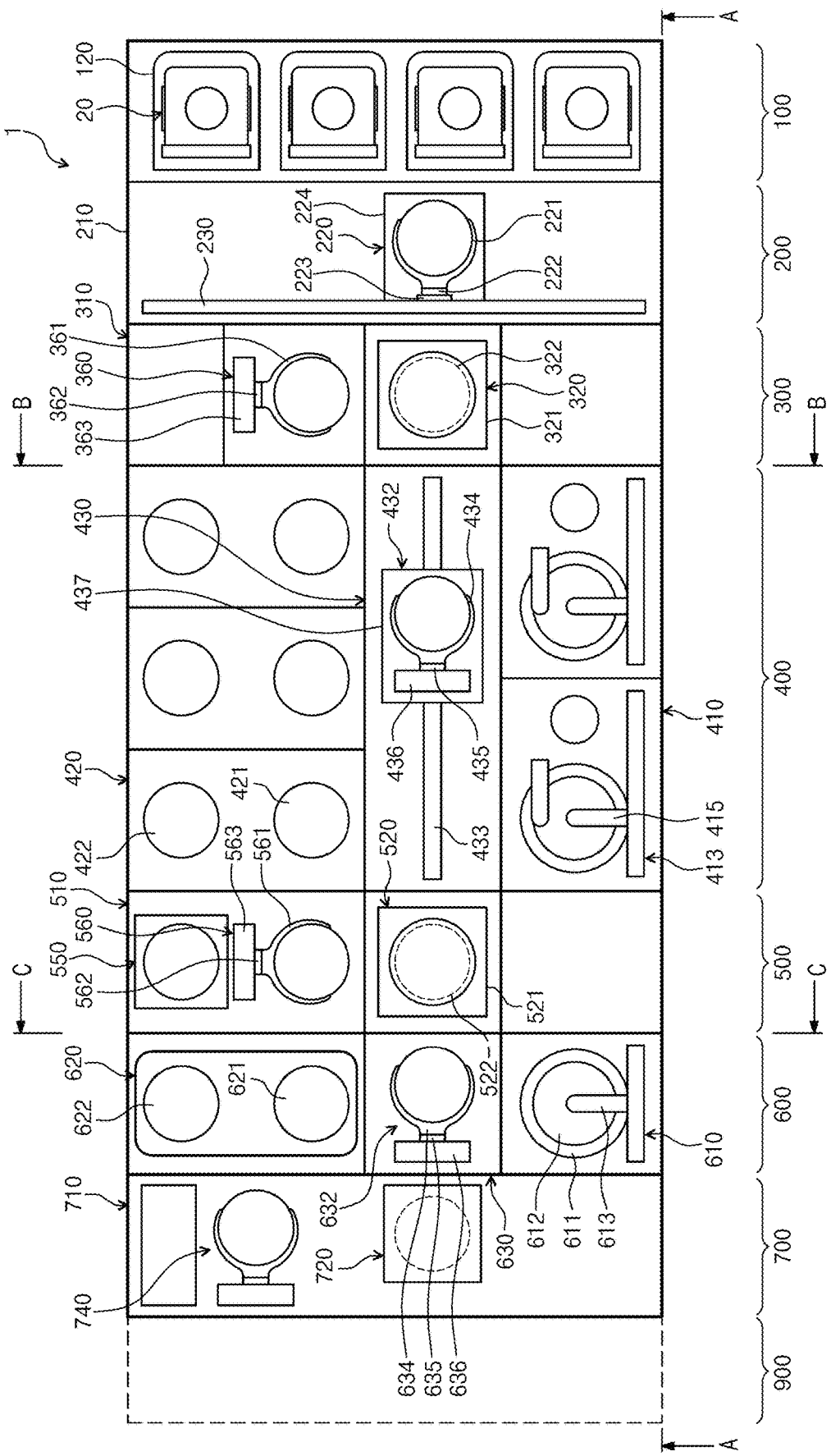
FIG. 1 is a plan view illustrating equipment of treating a substrate.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Figure 2:
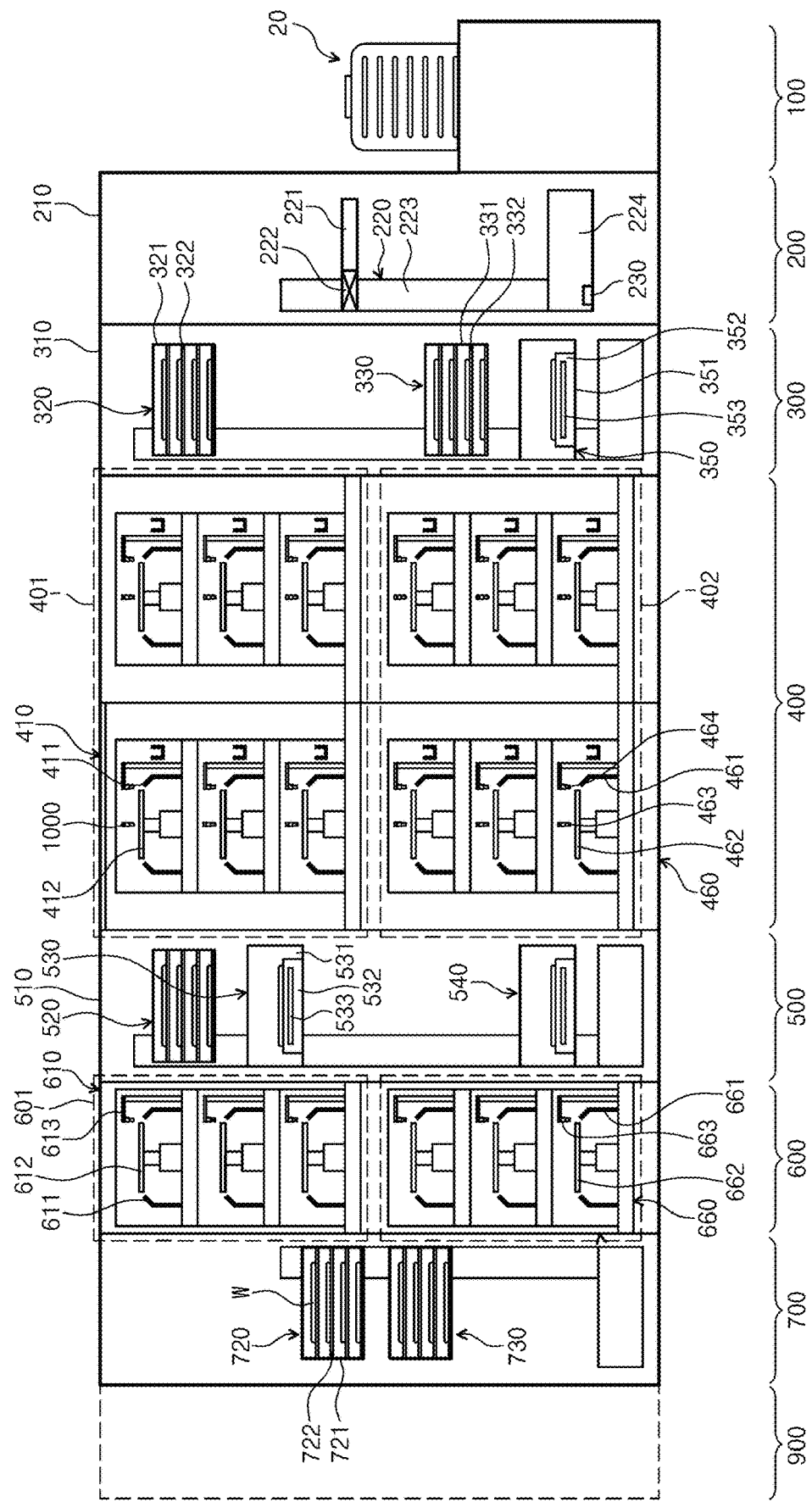
FIG. 2 is a view illustrating the equipment of treating the substrate of FIG. 1 when viewed in a direction of A-A.
Figure 3:
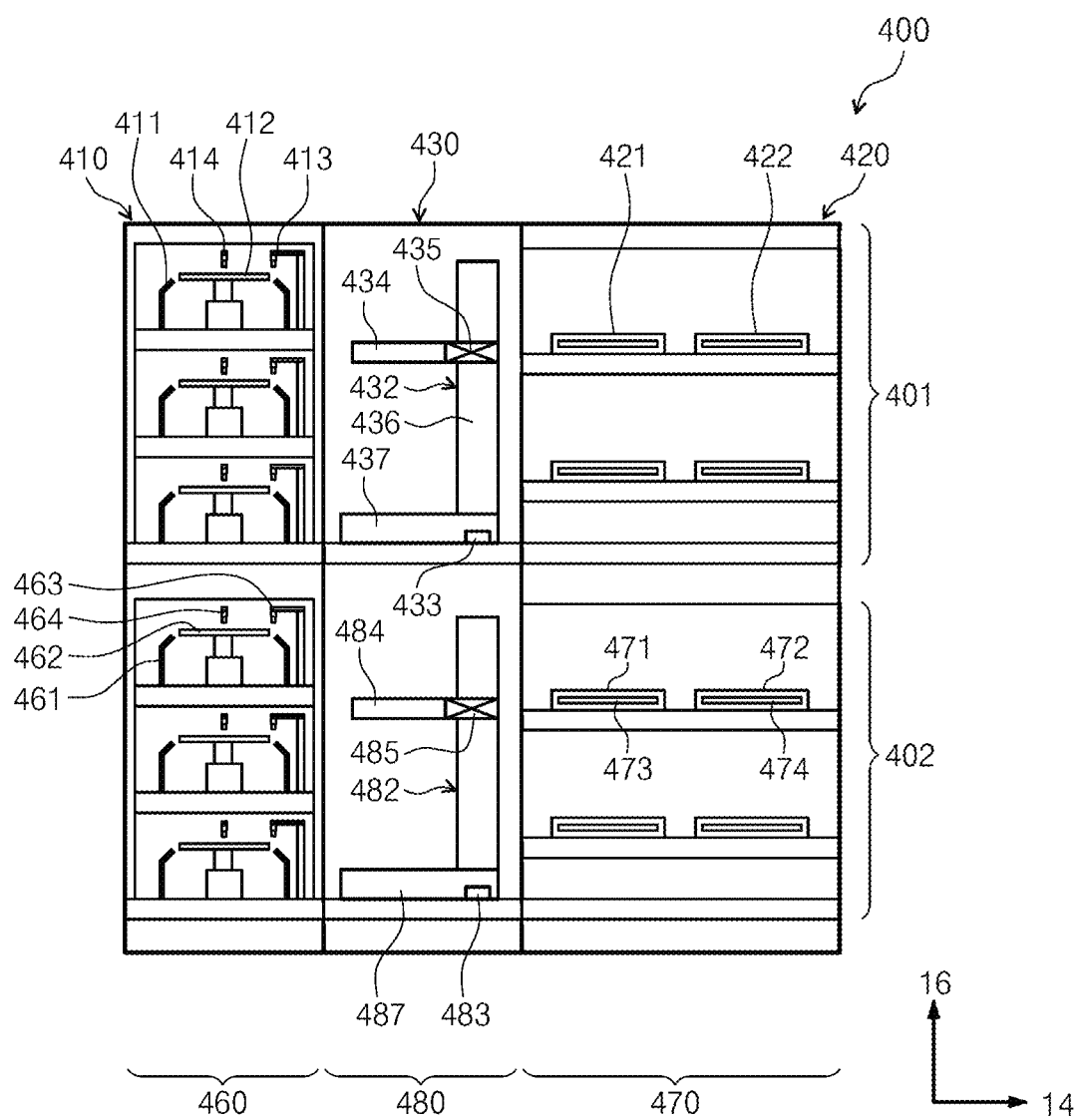
FIG. 3 is a view illustrating the equipment of treating the substrate of FIG. 1 when viewed in a direction of B-B.
Figure 4:
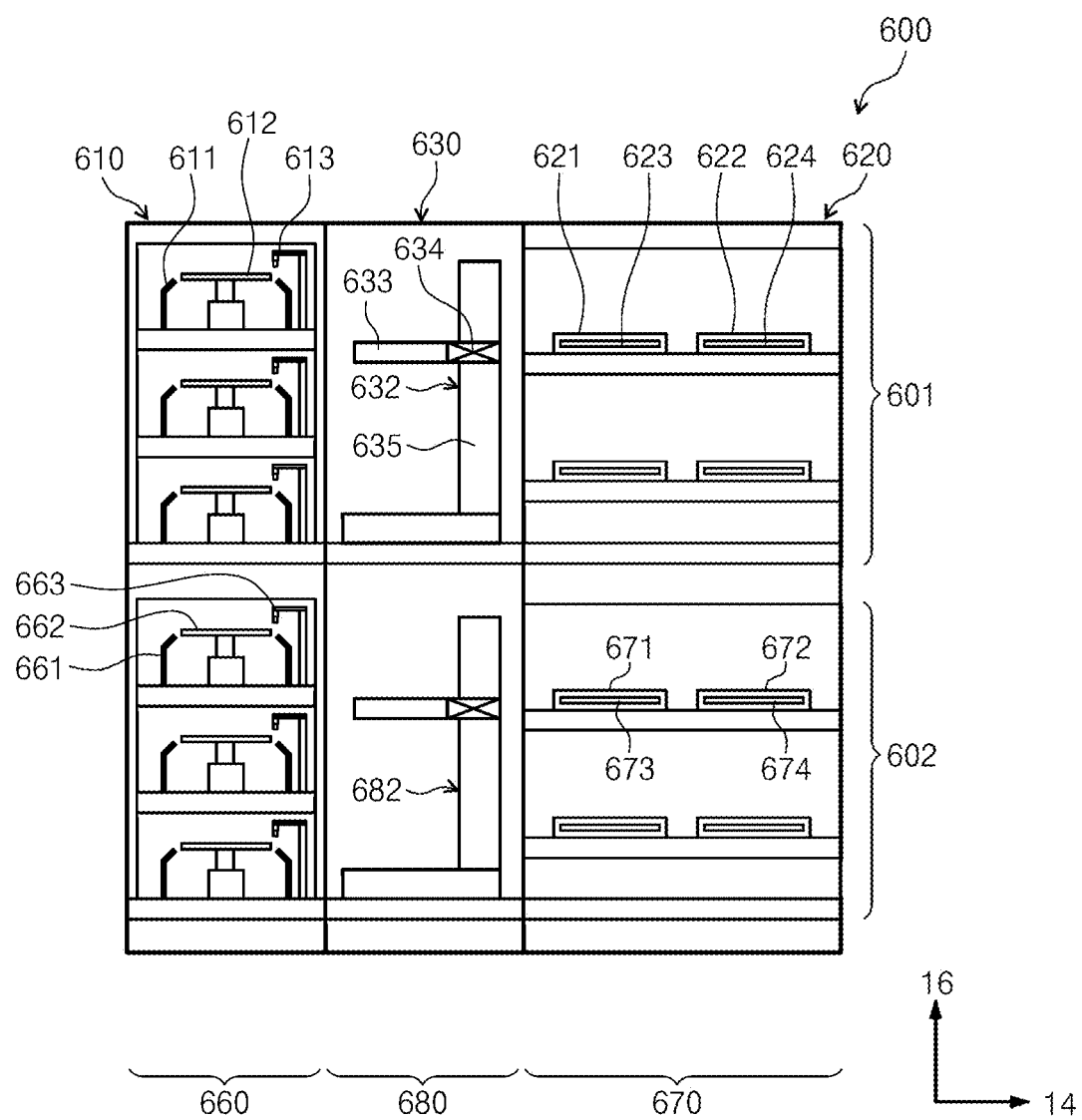
FIG. 4 is a view illustrating the equipment of treating the substrate of FIG. 1 when viewed in a direction of C-C.

FIG. 1 is a plan view illustrating equipment of treating a substrate, FIG. 2 is a view illustrating the equipment of treating the substrate of FIG. 1 when viewed in a direction of A-A, FIG. 3 is a view illustrating the equipment of treating the substrate of FIG. 1 when viewed in a direction of B-B, and FIG. 4 is a view illustrating the equipment of treating the substrate of FIG. 1 when viewed in a direction of C-C.

Referring to FIGS. 1 to 4, equipment (substrate treating equipment) 1 of treating a substrate includes a load port 100, an index module 200, a first buffer module 300, a coating/developing module 400, a second buffer module 500, a pre/post-exposure treatment module 600, and an interface module 700. The load port 100, the index module 200, the first buffer module 300, the coating/developing module 400, the second buffer module 500, the pre/post-exposure treatment module 600, and the interface module 700 are sequentially disposed in a row in one direction.

Hereinafter, a direction in which the load port 100, the index module 200, the first buffer module 300, the coating/developing module 400, the second buffer module 500, the pre/post-exposure treatment module 600, and the interface module 700 are disposed will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A substrate 'W' is moved while being received in a cassette 20. In this case, the cassette 20 has a structure that is sealed from the outside. For example, a front open unified pod (FOUP) that has a door on the front side may be used as the cassette 20.

Hereinafter, the load port 100, the index module 200, the first buffer module 300, the coating/developing module 400, the second buffer module 500, the pre/post-exposure treatment module 600, and the interface module 700 will be described in detail.

The load port 100 has a carrier 120 on which the cassette 20 having the substrates 'W' received therein is placed. A plurality of carriers 120 are provided, and are disposed along the second direction 14 in a row. In FIG. 1, four carriers 120 are provided.

The index module 200 transfers the substrate 'W' between the cassette 20 placed on the carrier 120 of the load port 100 and the first buffer module 300. The index module 200 has a frame 210, an index robot 220, and a guide rail 230. The frame 210 has a substantially rectangular parallelepiped shape having a hollowed structure, and is interposed between the load part 100 and the first buffer module 300.

The frame 210 of the index module 200 may be provided at a height lower than that of a frame 310 of the first buffer module 300, which will be described below. The index robot 220 and the guide rail 230 are disposed in the frame 210. The index robot 220 has a four-axis driven structure allowing a hand 221 thereof directly handling the substrate 'W' to be movable and rotatable in the first direction 12, the second direction 14, and the third direction 16 The index robot 220 has the hand 221, an arm 222, a support 223, and a prop 224. The hand 221 is fixedly installed in the arm 222. The arm 222 has an extensible and rotatable structure. The support 223 has a longitudinal direction provided in the third direction 16. The arm 222 is coupled to the support 223 to be movable along the support 223. The support 223 is fixedly coupled to the prop 224. The guide rail 230 has a longitudinal direction provided in the second direction 14. The prop 224 is coupled to the guide rail 230 to be linearly movable along the guide rail 230. Although not illustrated, the frame 210 further includes a door opener that opens and closes a door of the cassette 20.

The first buffer module 300 has a frame 310, a first buffer 320, a second buffer 330, a cooling chamber 350, and a first buffer robot 360. The frame 310 has a rectangular parallelepiped shape having a hollowed structure, and is interposed between the index module 200 and the coating/developing module 400. The first buffer 320, the second buffer 330, the cooling chamber 350, and the first buffer robot 360 are positioned within the frame 310. The cooling chamber 350, the second buffer 330, and the first buffer 320 are arranged in the third direction 16 sequentially from the bottom The first buffer 320 is positioned at a height corresponding to a coating module 401 of the coating/developing module 400, which will be described below, and the second buffer 330 and the cooling chamber 350 are positioned at a height corresponding to a developing module 402 of the coating/developing module 400, which will be described below. A first buffer robot 360 is spaced apart from the second buffer 330, the cooling chamber 350, and the first buffer robot 320 by a specific distance in the second direction 14.

The first buffer 320 and the second buffer 330 temporarily store a plurality of substrates 'W'. The second buffer 330 has a housing 331 and a plurality of supports 332. The supports 332 are disposed inside the housing 331, and are spaced apart from each other in the third direction 16. One substrate 'W' is placed on each of the supports 332. The housing 331 has openings (not illustrated) in directions of providing the index robot 220, the first buffer robot 360, and a developing robot 482 of the developing module 402 to be described below such that the index robot 220, the first buffer robot 360, and the developing robot 482 introduce or withdraw the substrate 'W' into or out of the support 332 provided inside the housing 331. The first buffer 320 has a structure substantially similar to that of the second buffer 330. Meanwhile, a housing 321 of the first buffer 320 has openings in directions of providing the first buffer robot 360 and a coating robot 432 positioned in the coating module 401 to be described below. The number of supports 322 provided in the first buffer 320 may be equal to or different from the number of supports 332 provided in the second buffer 330.

According to an example, the number of the supports 332 provided in the second buffer 330 may be larger than the number of the supports 332 provided in the first buffer 320.

The first buffer robot 360 transfers the substrate 'W' between the first buffer 320 and the second buffer 330. The first buffer robot 360 has a hand 361, an arm 362, and a support 363. The hand 361 is fixedly installed in the arm 362. The arm 362 has an extensible structure such that the hand 361 is movable in the second direction 14. The arm 362 is coupled to the support 363 to be linearly movable along the support 363 in the third direction 16. The support 363 has a length extending from a position corresponding to the second buffer 330 to a position corresponding to the first buffer 320. The support 363 may be provided to extend longer upwards or downward. The first buffer robot 360 may be provided such that the hand 361 is simply two-axis driven along the second direction 14 and the third direction 16.

The cooling chamber 350 cools a substrate 'W'. The cooling chamber 350 has a housing 351 and a cooling plate 352. The cooling plate 352 has a top surface thereof on which a substrate 'W' is positioned and a cooling unit 353 that cools the substrate 'W'. Various types such as a cooling type using cooling water and a cooling type using a thermoelectric element may be used as the cooling unit 353. A lift pin assembly (not illustrated) may be provided in the cooling chamber 350 to locate the substrate 'W' on the cooling plate 352. The housing 351 has openings (not illustrated) in directions of providing the index robot 220 and the developing robot 482 provided in the developing module 402 to be described below such that the index robot 220 and the development robot 482 introduce or withdraw the substrate 'W' into or out of the cooling plate 352. In addition, doors (not illustrated) that open and close the above-described openings may be provided in the cooling chamber 350.

The coating/developing module 400 performs a process of coating a photoresist on a substrate 'W' before an exposing process and a process of developing the substrate 'W' after the exposing process. The coating/developing module 400 has a substantially rectangular parallelepiped shape. The coating/developing module 400 has a coating module 401 and a developing module 402. The coating module 401 and the developing module 402 may be disposed to be partitioned from each other in different layers. According to an example, the coating module 401 is situated on the developing module 402.

The coating module 401 performs a process of coating a photosensitive liquid, such as a photoresist, on a substrate 'W' and a heat treatment process of, for example, heating and cooling the substrate 'W' before and after the resist coating process. The coating module 401 has a resist coating chamber 410, a bake chamber 420, and a carrying chamber 430. The resist coating chamber 410, the bake chamber 420, and the carrying chamber 430 are sequentially disposed in the second direction 14. Accordingly, the resist coating chamber 410 and the bake chamber 420 are spaced apart from each other in the second direction 14 while the carrying chamber 430 is interposed therebetween.

A plurality of resist coating chambers 410 may be provided in each of the first direction 12 and the third direction 16. In the drawings, six resist coating chambers 410 are illustrated by way of example. A plurality of bake chamber 420 may be provided in each of the first direction 12 and the third direction 16. In the drawings, six resist bake chambers 420 are illustrated by way of example. However, unlike this, a larger number of bake chambers 420 may be provided.

The carrying chamber 430 is positioned in parallel to the first buffer 320 of the first buffer module 300 in the first direction 12. A coating robot 432 and a guide rail 433 may be positioned in the carrying chamber 430. The carrying chamber 430 has a substantially rectangular shape. The coating robot 432 transfers a substrate 'W' between the bake chambers 420, the resist coating chambers 410, the first buffer 320 of the first buffer module 300, and the first cooling chamber 520 of the second buffer module 500. The guide rail 433 is disposed such that the longitudinal direction thereof is parallel to the first direction 12. The guide rail 433 guides the coating robot 432 such that the coating robot 432 linearly moves in the first direction 12. The coating robot 432 has a hand 434, an arm 435, a support 436, and a prop 437. The hand 434 is fixedly mounted on the arm 435. The arm 435 has an extensible structure such that the hand 434 is movable horizontally. The support 436 is disposed such that a longitudinal direction thereof is provided in the third direction 16. The arm 435 is coupled to the support 436 to be linearly movable along the support 436 in the third direction 16.

The support 436 is fixedly coupled to the prop 437, and the prop 437 is coupled to the guide rail 433 to be movable along the guide rail 433.

The bake chamber 420 is to perform heat treatment the substrate 'W'. For example, the bake chambers 420 perform a prebake process of eliminating organic substances and moisture from the surface of the substrate 'W' by heating the substrate 'W' at a predetermined temperature before coating a photoresist or a soft bake process performed after coating a photoresist to the substrate 'W', and performs a cooling process of cooling the substrate 'W' after the heating processes.

The resist coating chambers 410 have the same structure. However, the resist coating chambers 410 may employ mutually different types of photoresists. For example, a chemical amplification resist may be used as the photoresist. The resist coating chamber 410 coats photoresist onto the substrate 'W'.

The resist coating chamber 410 has a housing 411, a support plate 413, and a nozzle 413. The housing 411 has the shape of a cup having an open upper portion. The support plate 412 is positioned inside the housing 411 and supports the substrate 'W'. The support plate 412 is rotatably provided. The nozzle 413 feeds a photoresist onto the substrate 'W' placed on the support plate 412. The nozzle 413, which has a cylindrical tubular shape, feeds the photoresist to the center of the substrate 'W'. Alternatively, the nozzle 413 has a length corresponding to the diameter of the substrate 'W' and an exhaust port of the nozzle 413 may be provided in the form of a slit. Further, additionally, the resist coating chamber 410 further include a nozzle 414 to feed a cleaning liquid, such as deionized water, to clean the surface of the substrate 'W' coated with the photoresist, and an edge nozzle member to feed a cleaning liquid, such as a thinner, to remove photoresist from a bottom edge part of the substrate.

The resist coating chamber 410 may serve as an apparatus (substrate treating apparatus) 800 for treating a substrate in the following drawings.

Figure 5:
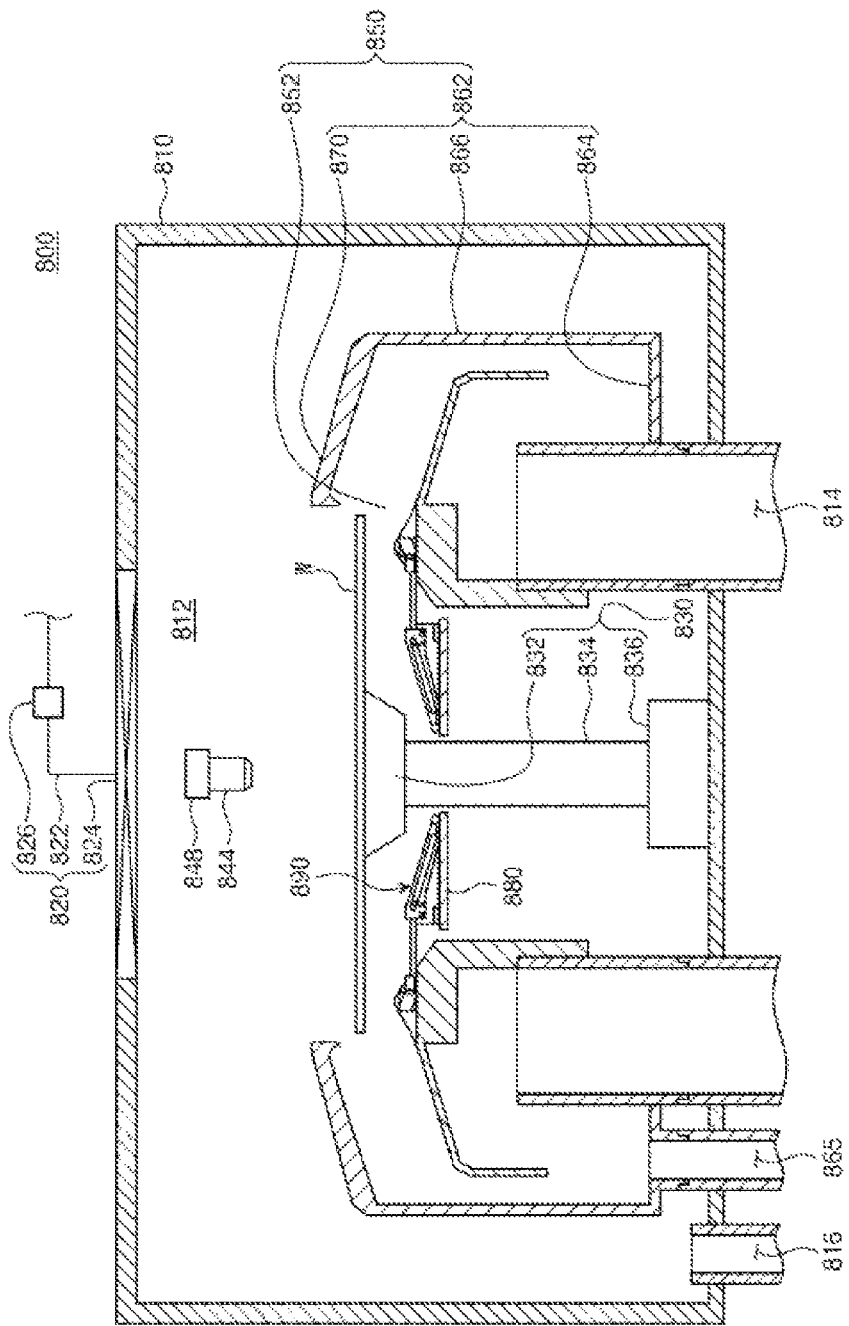
FIG. 5 is a sectional view illustrating an apparatus for treating a substrate.

FIG. 5 is a sectional view illustrating a substrate treating apparatus.

Referring to FIG. 5, the substrate treating apparatus 800 may include a housing 810, an air flow supplying unit 820, a substrate support unit 830, a treating bowl 850, a liquid feeding unit 840, and an edge nozzle member 890.

The housing 810 is provided in the shape of a rectangular tub having a space (inner space) 812 provided therein. An opening (not illustrated) is formed in one side of the housing 810. The opening serves as an entrance through which the substrate 'W' is introduced or withdrawn. A door is installed in the opening, and the door opens or closes the opening. The door seals the space 812 of the housing 810 by closing the opening when a substrate treating process is performed. The housing 810 is formed in a bottom surface thereof with an inner exhaust port 814 and an outer exhaust port 816. An air flow formed in the housing 810 is exhausted to the outside through the inner exhaust port 814 and the outer exhaust port 816. According to an example, the air flow provided in the treating bowl 850 may be exhausted through the inner exhaust port 814 and the air flow provided outside the treating bowl 850 may be exhausted through the outer exhaust port 816.

The air flow supplying unit 820 forms a descending current in the inner space of the housing 810. The air flow supplying unit 820 includes an air flow supplying line 822, a fan 824, and a filter 826. The air flow supplying unit 820 is connected to the housing 810. The air flow supplying line 822 supplies external air to the housing 810. The filter 826 filers air supplied from the air flow supplying line 822. The filter 826 removes impurities contained in air. The fan 824 is installed on the top surface of the housing 810. The fan 824 is positioned in the central area on the top surface of the housing 810. The fan 824 forms the descending current in the inner space of the housing 810. When air is supplied to the fan 824 from the air flow supplying line 822, the fan 824 supplies air downward.

The substrate support unit 830 supports the substrate 'W' in the inner space of the housing 810. The substrate support unit 830 rotates the substrate 'W'. The substrate support unit 830 includes a spin chuck 832, a rotating shaft 834, and a driver 836. The spin chuck 832 serves as a substrate support member 832 to support the substrate. The spin chuck 832 is provided to have the shape of a circular plate. The substrate 'W' makes contact with a top surface of the spin chuck 832. The spin chuck 832 is provided to have a diameter less than that of the substrate 'W'. According to an example, the spin chuck 832 may chuck the substrate 'W' by vacuum-suctioning the substrate 'W'. Alternatively, the spin chuck 832 may serve as an electrostatic chuck to chuck the substrate 'W' using static electricity. In addition, the spin chuck 832 may chuck the substrate 'W' by physical force.

The rotating shaft 834 and the driver 836 serve as rotation members 834 and 836 to rotate the spin chuck 832. The rotating shaft 834 supports the spin chuck 832 under the spin chuck 832. The rotating shaft 834 is provided such that the longitudinal direction thereof faces a vertical direction.

The rotating shaft 834 is provided to be rotatable about the central axis thereof. The driver 836 provides driving force such that the rotating shaft 834 is rotated. For example, the driver 836 may be a motor to change revolution per minute (RPM) of the rotating shaft 834.

The liquid feeding unit 840 feeds a treating liquid and a pre-wet liquid onto the substrate 'W'. The liquid feeding unit 840 may include an arm 848 and a treating nozzle 844. The arm 848 is provided to have the shape of a bar. The treating nozzle 844 is fixedly coupled to one end portion of the arm 848. For example, the treating liquid may be a photosensitive liquid such as a photoresist. According to a present embodiment, although a single treating nozzle 844 is mounted on the arm 848, a plurality of treating nozzles 844 are provided and arranged in a row on the arm 848. The treating nozzles 844 may exhaust mutually different types of photoresist liquids.

The treating bowl 850 is positioned in the inner space 812 of the housing 810. The treating bowl 850 provides a treatment space therein. The treating bowl 850 is provided to have a cup shape having an open upper portion. The treating bowl 850 includes an inner cup 852 and an outer cup 862. The inner cup 852 is provided in a circular plate shape surrounding the rotating shaft 834. When viewed from above, the inner cup 852 is positioned to be overlapped with the inner exhaust port 814.

Figure 6:
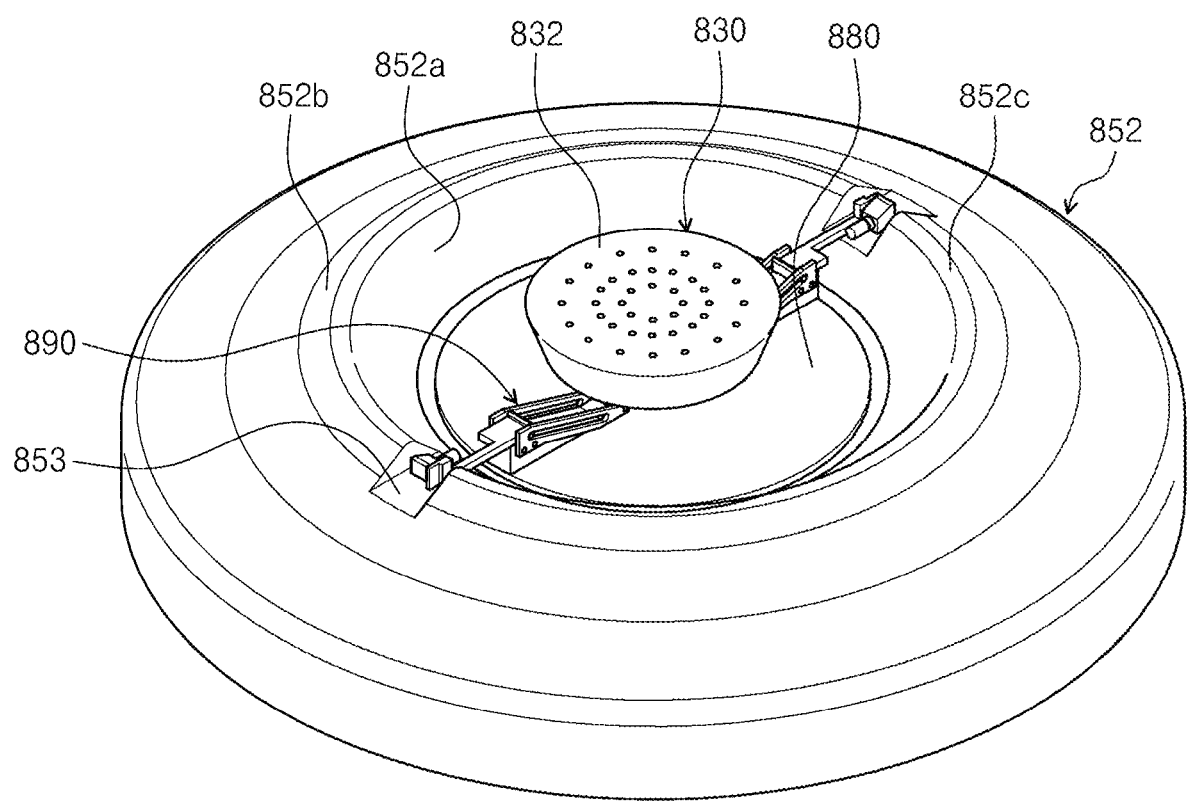
FIG. 6 is a perspective view illustrating an inner cup.
Figure 7:
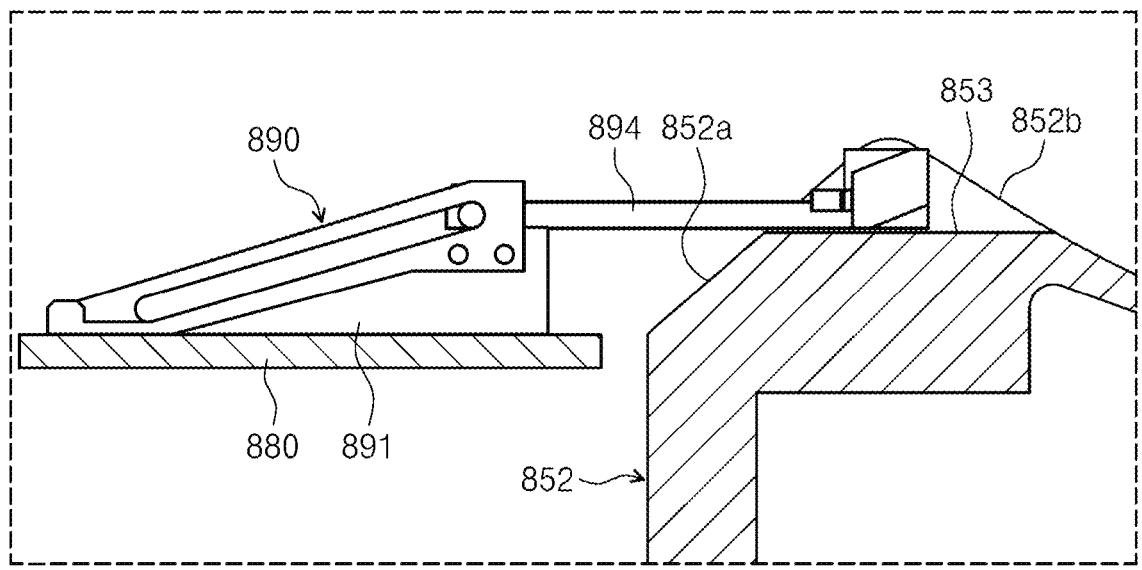
FIG. 7 is an enlarged sectional view illustrating a subject matter.

FIG. 6 is a perspective view illustrating the inner cup, and FIG. 7 is an enlarged sectional view illustrating a subject matter.

Referring to FIGS. 5 to 7, when viewed from above, the top surface of the inner cup 852 is provided such that an outer region and an inner region thereof are inclined at mutually different angles. According to an example, the outer region 852*b* of the inner cup 852 faces a direction more inclined downward as the outer region 852*b* becomes gradually away from the substrate support unit 830, and the inner region 852*a* faces a direction more inclined downward as the inner region gradually becomes away from the substrate support unit 830. A vertex point 852*c* at which the outer region 852*b* and the inner region 852*a* of the inner cup 852 meet each other is provided to correspond to the bottom edge part of the substrate 'W' in the vertical direction.

Meanwhile, the inner cup 852 has a nozzle groove 853 to place the edge nozzle 896 of the nozzle arm 894. The nozzle groove 853 may be provided to pass from the inner region 852*a* to the outer region 852*b*.

Referring back to FIG. 5, the outer cup 862 is provided in the shape of a cup to surround the substrate support unit 830 and the inner cup 852. The outer cup 862 has a bottom wall 864, a sidewall 866, and a top wall 870. The bottom wall 864 is provided to have the shape of a circular plate having a hollowed structure. A recovery line 865 is connected to the bottom wall 864. The recovery line 865 recovers the treating liquid supplied on the substrate 'W'. The treating liquid recovered by the recovery line 865 may be reused by an external liquid regeneration system. The sidewall 866 is provided to have the shape of a cylindrical tub to surround the substrate support unit 830. The sidewall 866 extends in a vertical direction from the side end of the bottom wall 864. The sidewall 866 extends upward from the bottom wall 864. The top wall 870 extends inward from the outer cup 862 from the upper end of the sidewall 866. The top wall 870 becomes closer to the substrate support unit 830 at the upper portion of the top wall 870. The top wall 870 is provided to have the shape of a ring. The upper end of the top wall 870 is positioned higher than the substrate 'W' supported by the substrate support unit 830.

Figure 8:
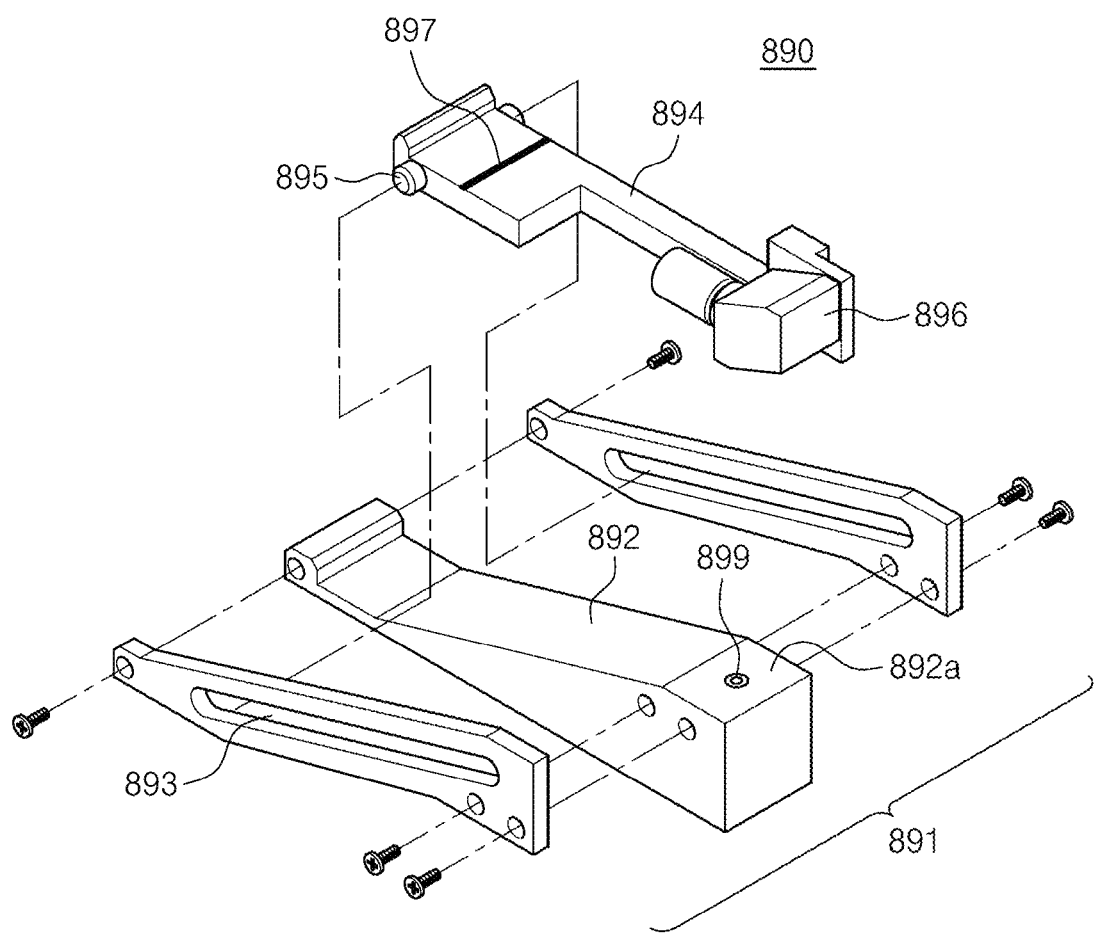
FIG. 8 is an exploded perspective view illustrating an edge nozzle member.
Figure 9:
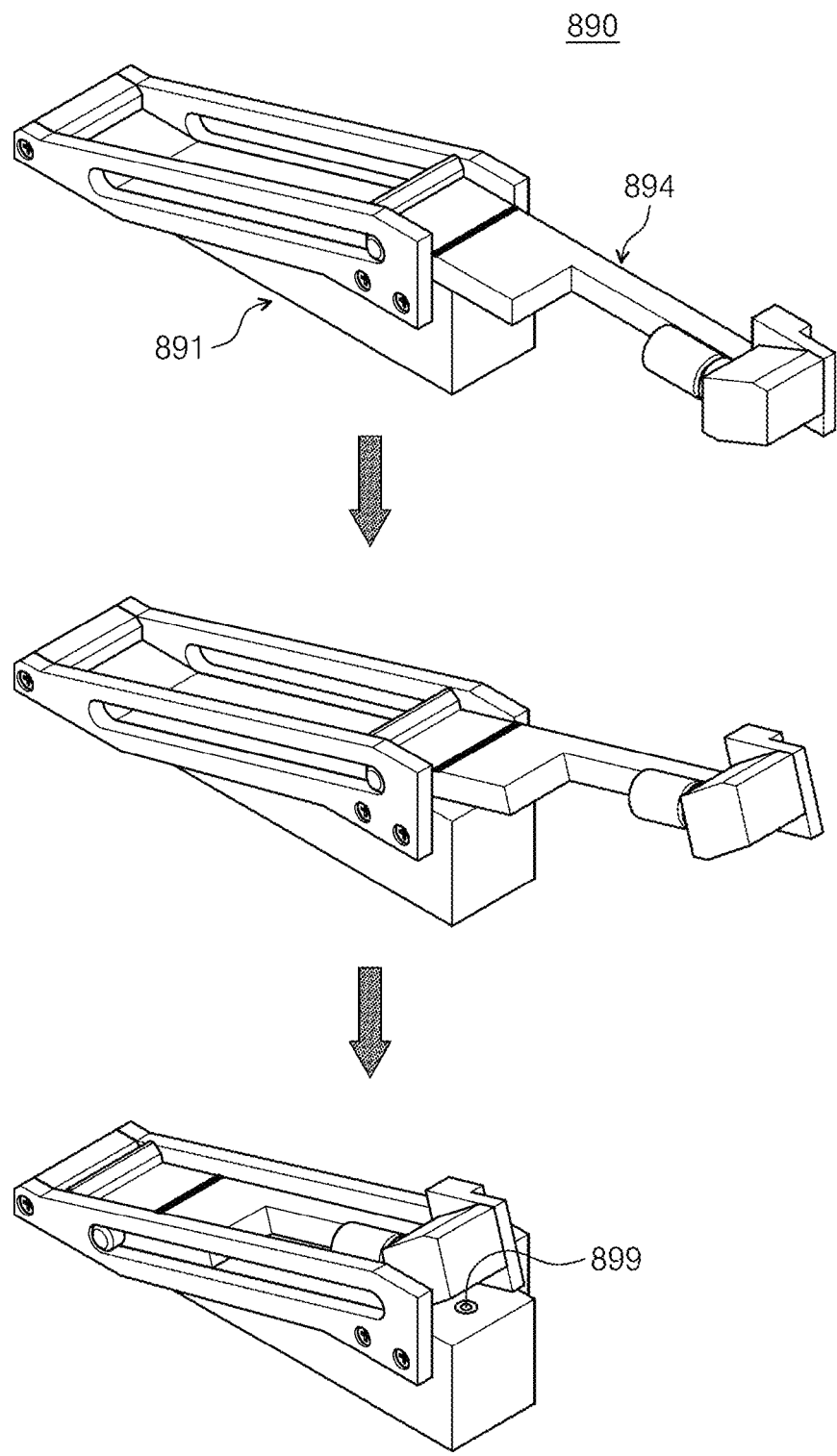
FIG. 9 is a view illustrating the operation of an edge nozzle member.

FIG. 8 is an exploded perspective view illustrating an edge nozzle member, and FIG. 9 is a view illustrating the procedure in which the edge nozzle member moves from a setting portion to a standby position.

Referring to FIGS. 7 to 9, an edge nozzle member 890 may be provided on a base plate 880 provided to face the bottom surface of a substrate seated on the substrate support unit 830.

The edge nozzle member 890 may spray the treating liquid to the bottom edge part of the substrate seated on the substrate support unit 830. For example, the edge nozzle member 890 may include a main body 891, a nozzle arm 894, and a fixing member 899.

The main body 891 may be mounted on the base plate 880. The main body 891 may have a slide surface 892 provided on the top surface thereof to allow the nozzle arm 894 to slide, and have opposite side surfaces formed therein with guide holes 893.

The nozzle arm 894 has one end to mount an edge nozzle 896. The nozzle arm 894 may be provided to slide on the main body 891. Another end of the nozzle arm 894 may be provided at opposite sides thereof with a guide pin 895 to be inserted into the guide holes 893 of the main body 891. In addition, the nozzle arm 894 may include a magnetic substance. The nozzle arm 894 may include a marking part 897 to determine the setting position. When the nozzle arm 894 is positioned at the setting position, as the edge nozzle 896 is inserted into the nozzle groove 853, the edge nozzle 896 is positioned significantly close to the bottom edge part of the substrate while spraying the cleaning liquid. The marking part 897 may be positioned at a position matched to the end of the main body 891, when the nozzle arm 894 is normally placed at the setting position (see FIG. 9). The marking part 897 is marked in an intaglio pattern and an embossed pattern, or marked in blue color on the top surface of the nozzle arm 894 such that the marking part 897 is easily checked with naked eyes.

The fixing member 899 may maintain the setting position of the nozzle arm 894 on the main body 891. The fixing member 899 may include a permanent magnet. The fixing member 899 may be mounted on a flat top surface 892a of the main body 891. The position of the nozzle arm 894, which is normally placed in the setting position, may be fixed by the magnetic force of the fixing member 899.

Meanwhile, when the treating bowl 850 is extracted for maintenance thereof, it is conventionally difficult to extract the treating bowl 850 due to the interference with the edge nozzle 896 placed in the nozzle groove 853. However, according to the inventive concept, the nozzle arm 894 is able to be withdrawn upward from the main body 891, so the treating bowl 850 may be easily extracted.

As illustrated in FIG. 9, the edge nozzle member 890 rotates the nozzle arm 894 at a specific angle (an angle the same as an inclination angle of the slide surface) upward and then slidably inserts the nozzle arm 894 into the slide surface 892 of the main body 891, when extracting the treating bowl 850. To the contrary, when the process is performed, the nozzle arm 894 may be slidably withdrawn from the main body 891 and may move to a setting position appropriate to the process.

FIGS. 10A to 10D are views illustrating the procedure in which an edge nozzle member is moved from a setting position to a standby position step by step.

Figure 10A:
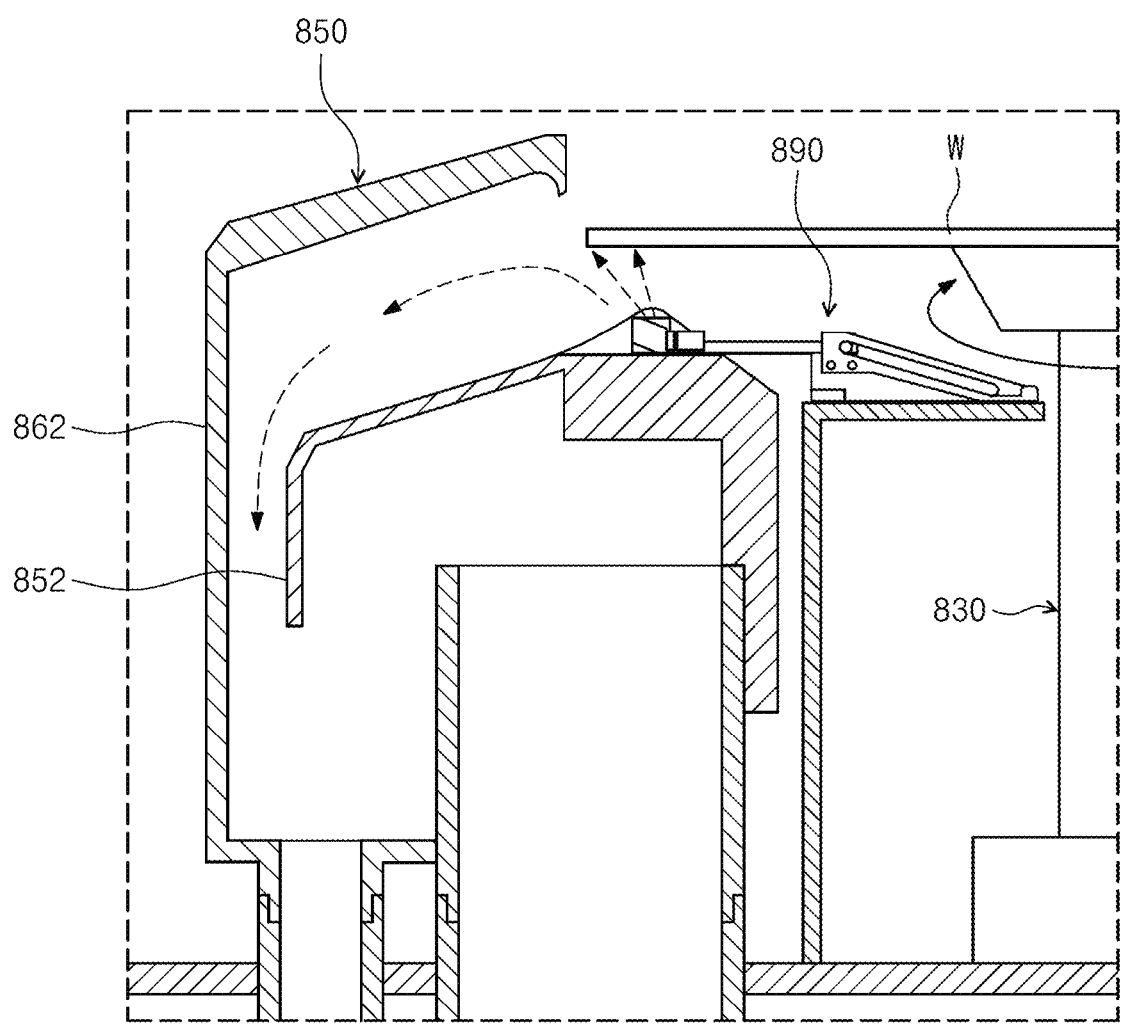
FIGS. 10A to 10D are views illustrating the procedure in which an edge nozzle member is moved from a setting position to a standby position step by step.

As illustrated in FIG. 10A, at the setting position, the edge nozzle 896 may spray the cleaning liquid to the bottom edge part of the substrate from a position significantly close to the bottom edge part of the substrate in the state that the edge nozzle 896 is inserted into the nozzle groove 853.

Figure 10B:
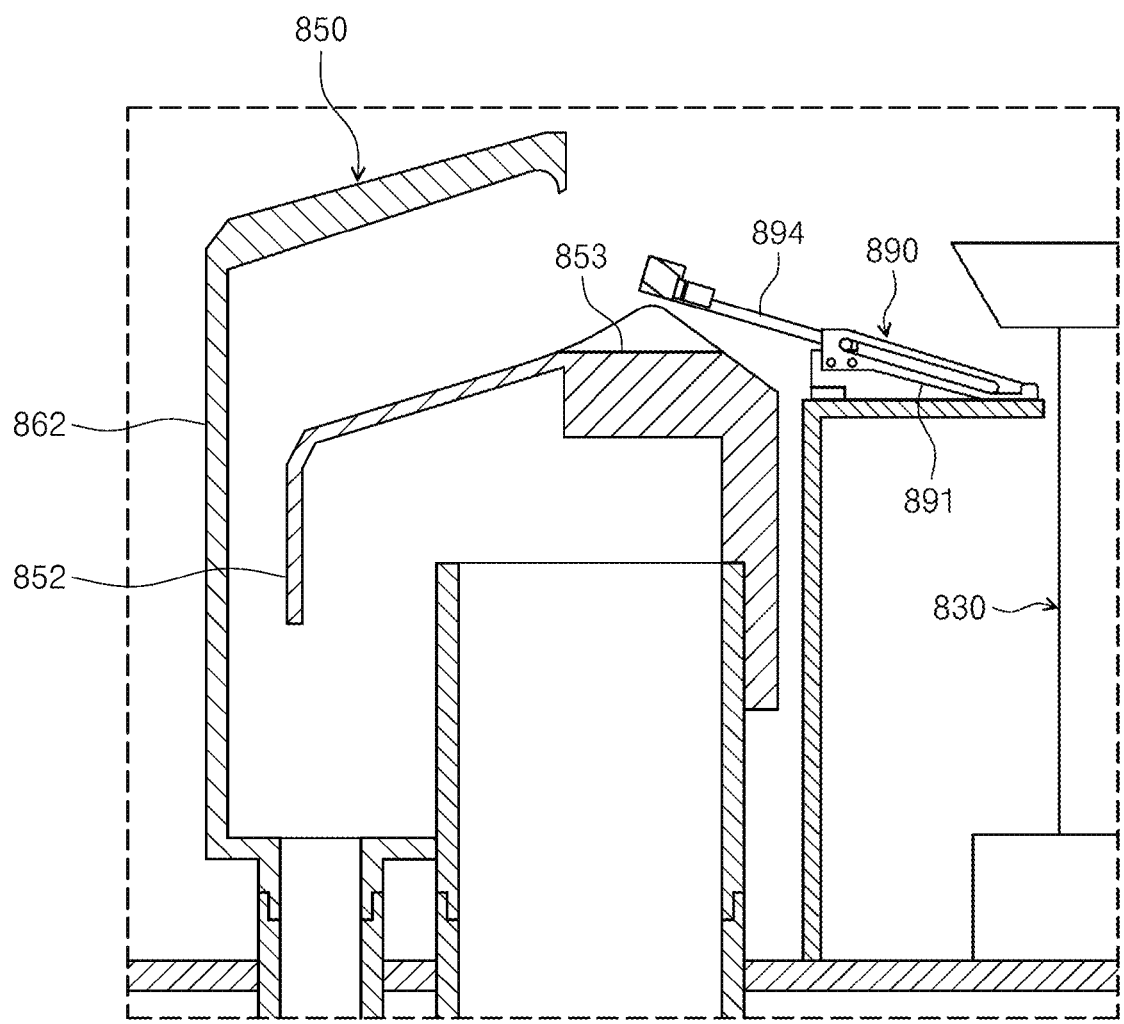
Figure 10C:
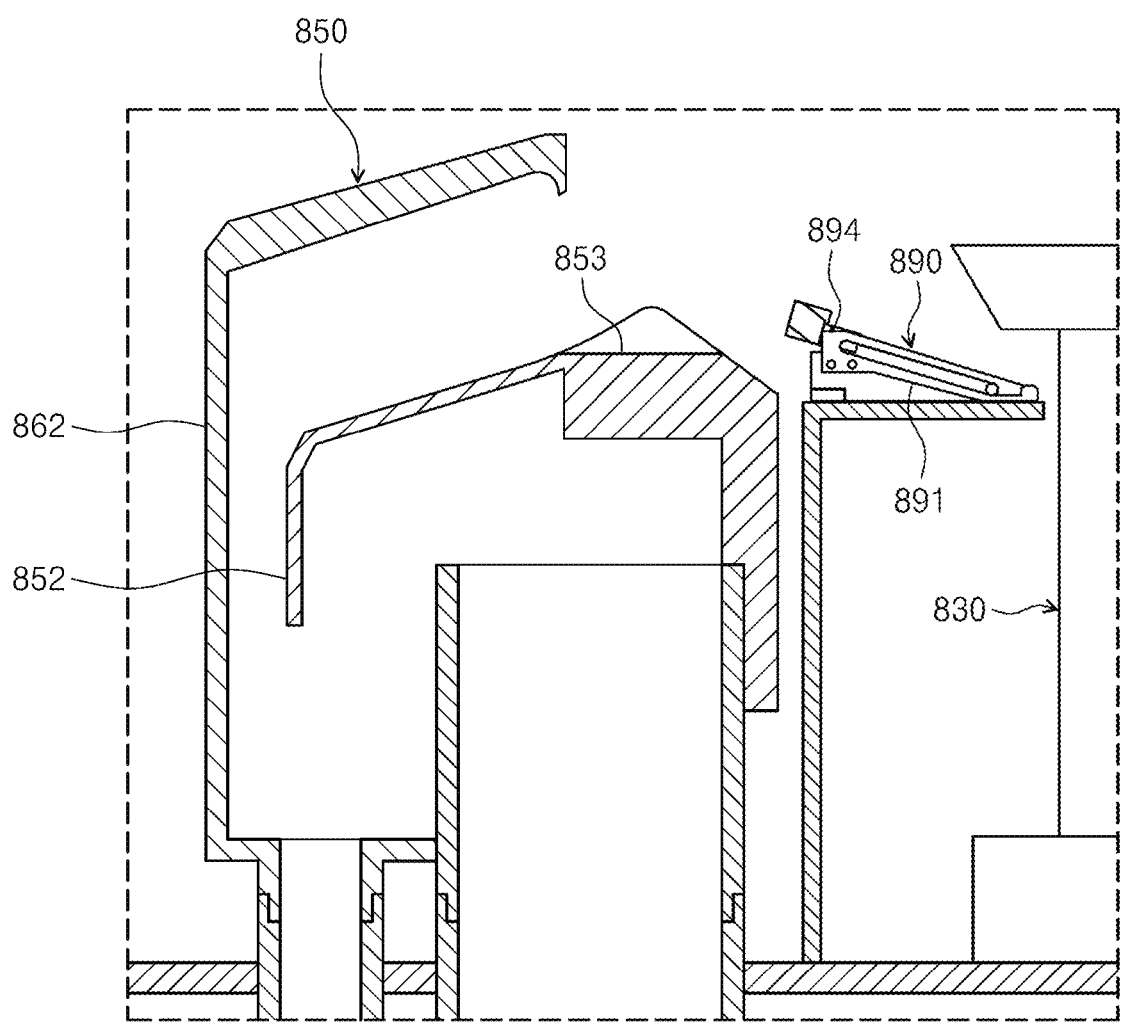

Meanwhile, when a worker wants to detach the treating bowl 850 for maintenance, a worker lifts the nozzle arm 894 upward while rotating at a specific angle (which is the same as an inclination angle of the slide surface), and then pushes the nozzle arm 894 inward as illustrated in FIG. 10B. In this case, the nozzle arm 894 is withdrawn inward from an inner circumferential surface of the treating bowl 850, as the guide pin 895 moves backward along the guide hole 893 (see FIG. 10C).

Figure 10D:
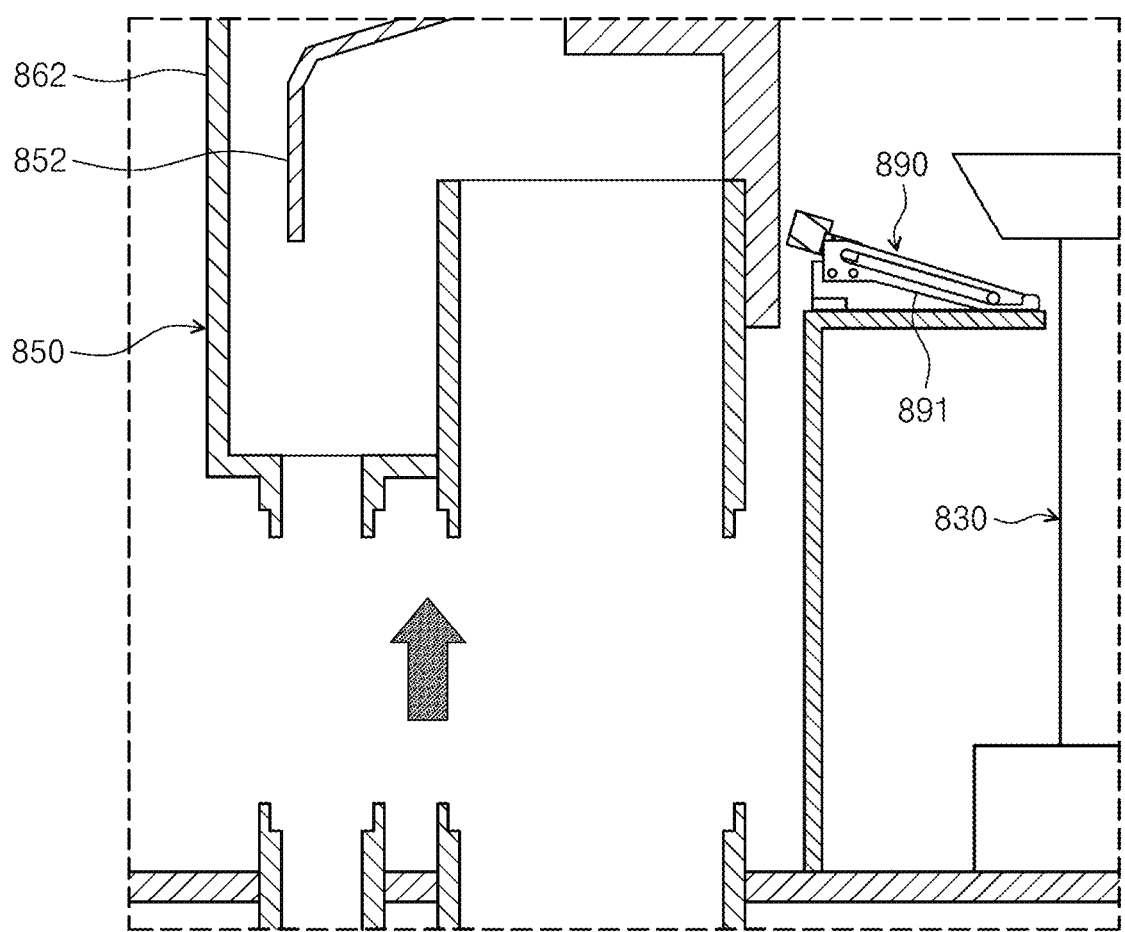

As described above, when the movement of two nozzle arm 894 to the standby positions is completed, the treating bowl 850 may be easily detached without interfering with the edge nozzle members 890 (see FIG. 10D).

Referring back to FIGS. 2 to 5, the developing module 402 performs a developing process of removing a portion of the photoresist by feeding a developer to obtain a pattern on the substrate 'W', and a heat treatment process, such as heating and cooling, which are performed with respect to the substrate 'W' before and after the developing process. The developing module 402 has a developing chamber 460, a bake chamber 470, and a carrying chamber 480. The developing chamber 460, the bake chamber 470, and the carrying chamber 480 are sequentially arranged in the second direction 14. Accordingly, the developing chamber 460 and the bake chamber 470 are spaced apart from each other in the second direction 14 while the carrying chamber 480 is interposed therebetween. A plurality of developing chambers 460 may be provided in each of the first direction 12 and the third direction 16. In the drawings, six developing chambers 460 are illustrated by way of example. A plurality of bake chamber 470 may be provided in each of the first direction 12 and the third direction 16. In the drawings, six developing chambers 470 are illustrated by way of example. However, unlike this, a larger number of bake chambers 470 may be provided.

The carrying chamber 480 is positioned in parallel to the second buffer 330 of the first buffer module 300 in the first direction 12. A developing robot 482 and a guide rail 483 are positioned in the carrying chamber 480. The carrying chamber 480 has a substantially rectangular shape. The developing robot 482 transfers the substrate 'W' between the bake chambers 470, the developing chambers 460, the second buffer 330 of the first buffer module 300, and the second cooling chamber 540 of the second buffer module 500 The guide rail 483 is disposed such that the longitudinal direction thereof is provided in parallel to the first direction 12. The guide rail 483 guides the developing robot 482 such that the developing robot 482 linearly moves in the first direction 12. The index robot 482 has the hand 484, an arm 485, a support 486, and a prop 487. The hand 484 is fixedly installed in the arm 485. The arm 485 has an extensible structure such that the hand 484 is movable horizontally. The support 486 is disposed such that a longitudinal direction thereof is provided in the third direction 16. The arm 485 is coupled to the support 486 to be linearly movable in the third direction 16 along the support 486. The support 486 is fixedly coupled to the prop 487. The prop 487 is coupled to the guide rail 483 to be linearly movable along the guide rail 483.

The developing chambers 460 have the same structure. However, the types of developing liquids used in the developing chambers 460 are mutually different from each other. The developing chambers 460 remove a region, to which light is irradiated, of the photoresist coated on the substrate 'W'. In this case, even a region, to which light is irradiated, of a protective film is removed together. Alternatively, only regions, to which light is not irradiated, of the photoresist and the protective film, may be removed depending on the types of the photoresist.

The developing chamber 460 has a housing 461, a support plate 462, and a nozzle 463. The housing 461 has the shape of a cup having an open upper portion. The support plate 462 is positioned inside the housing 461 and supports the substrate 'W'. The support plate 462 is rotatably provided. The nozzle 463 feeds a developer onto the substrate 'W' placed on the support plate 462. The nozzle 463, which has a cylindrical tubular shape, feeds the developer to the center of the substrate 'W'. Alternatively, the nozzle 463 has a length corresponding to the diameter of the substrate 'W' and an exhaust port of the nozzle 463 may be provided in the form of a slit. Additionally, the developing chamber 460 may further include a nozzle 464 to feed a cleaning liquid, such as deionized water, to clean the surface of the substrate 'W' to which the developer is additionally fed.

The bake chamber 470 of the developing module 402 is to perform heat treatment for the substrate 'W'. For example, the bake chambers 470 may perform a post bake process of heating the substrate 'W' before the developing process, a hard bake process of heating the substrate 'W' after the developing process, and a cooling process of cooling the heated substrate after the bake process The bake chamber 470 has the cooling plate 471 and the heating plate 472 The cooling plate 471 includes the cooling unit 473 such as cooling water or a thermoelectric element. In addition, the heating plate 472 includes the heating unit 474 such as a heating wire or a thermoelectric element. The cooling plate 471 and the heat plate 472 may be provided in one bake chamber 470. Alternatively, some of the bake chambers 470 may include only the cooling plate 471, and others of the bake chambers 420 may include only the heating plate 472. Since the bake chamber 470 of the developing module 402 has the same configuration as that of the bake chamber of the coating module 401, the details thereof will be omitted below.

The second buffer module 500 is provided as a passage through which the substrate 'W' is transported, between the coating/developing module 400 and the pre/post-exposure treatment module 600. In addition, the second buffer module 500 performs a specific process, such as a cooling process or an edge exposing process, with respect to the substrate 'W'. The second buffer module 500 has a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the coating module 401. The second cooling chamber 540 is disposed at a height corresponding to the developing module 402. The buffer 520, the first cooling chamber 530, and the second cooling chamber 540 are sequentially arranged in a row in the third direction 16. When viewed from the top, the buffer 520 is disposed along the carrying chamber 430 of the coating module 401 in the first direction 12. The edge exposing chamber 550 is spaced apart from the buffer 520 or the first cooling chamber 530 by a specific distance in the second direction 14.

The second buffer robot 560 transports the substrate 'W' between the buffer 520, the first cooling chamber 530, and the edge exposing chamber 550. The second buffer robot 560 is situated between the edge exposing chamber 550 and the buffer 520. The second buffer robot 560 may have a structure that is similar to that of the first buffer robot 360. The first cooling chamber 530 and the edge exposing chamber 550 perform the subsequent processes with respect to the substrates W which has been subject the process in the coating module 401. The first cooling chamber 530 cools the substrate 'W' subject to the process in the coating module 401. The first cooling chamber 530 has a structure similar to that of the cooling chamber 350 of the first buffer module 300. The edge exposing chamber 550 exposes the edge regions of the substrates 'W' subject to the cooling process in the first cooling chamber 530. The buffer 520 temporarily stores the substrates W before the substrates 'W' subject to the exposing process in the edge exposing chamber 550 are transported to a pre-treatment module 601 to be described below. The second cooling chamber 540 cools the substrates 'W' before the substrates 'W' subject to the process in a post-treatment module 602, which will be described below, are transported to the development module 402. The second buffer module 500 may further have a buffer at a height corresponding to the developing module 402. In this case, the substrates 'W' subject to the process in the post-treatment module 602 may be transported to the development module 402 after being temporarily stored in the added buffer.

When the exposure apparatus 900 performs an immersing/exposing process, the pre/post-exposure treatment module 600 may perform a process of coating a protective film that protects the photoresist film coated to the substrate 'W' during the immersing/exposing process. The pre/post-exposure treatment module 600 may perform a process of cleaning the substrate 'W' after the exposing process. Furthermore, when the coating process is performed by using a chemical amplification resist, the pre/post-exposure treatment module 600 may perform a bake process after the exposing process.

The pre/post-exposure treatment module 600 has a pre-treatment module 601 and a post-treatment module 602. The pre-treatment module 601 performs a process of treating the substrate 'W' before the exposing process, and the post-treatment module 602 performs a process of treating the substrate 'W' after the exposing process. The pre-treatment module 601 and the post-treatment module 602 may be disposed to be partitioned from each other in different layers. According to an example, the pre-treatment module 601 is positioned on the post-treatment module 602. The pre-treatment module 601 has the same height as that of the coating module 401. The post-treatment module 602 has the same height as that of the developing module 402. The pre-treatment module 601 has a protective film coating chamber 610, a bake chamber 620, and a carrying chamber 630. The protective film coating chamber 610, the carrying chamber 630, and the bake chamber 620 are sequentially disposed in the second direction 14. Accordingly, the protective film coating chamber 610 and the bake chamber 620 are spaced apart from each other in the second direction 14 while the carrying chamber 630 is interposed therebetween. A plurality of protective film coating chambers 610 are provided and arranged in the third direction 16 such that the protective film coating chambers 610 are stacked on each other. Alternatively, a plurality of protective film coating chambers 610 may be provided in each of the first direction 12 and the third direction 16. A plurality of bake chambers 620 are provided and arranged in the third direction 16 such that the protective film coating chambers 610 are stacked on each other. Alternatively, a plurality of bake chambers 620 may be provided in each of the first direction 12 and the third direction 16.

The carrying chamber 630 is positioned in parallel to the second buffer 530 of the first buffer module 500 in the first direction 12. A pre-treatment robot 632 is positioned inside the carrying chamber 630. The carrying chamber 630 has a substantially square or rectangular shape. The pre-treatment robot 632 transfers the substrate 'W' among the protective film coating chambers 610, the bake chambers 620, the buffer 520 of the second buffer module 500, and the first buffer 720 of the interface module 700 to be described below. The pre-treatment robot 632 has a hand 633, an arm 634, and a support 635. The hand 633 is fixedly mounted onto the arm 634. The arm 634 has an extensible and rotatable structure. The arm 634 is coupled to the support 635 to be linearly movable along the support 635 in the third direction 16.

The protective film coating chamber 610 applies a protective film onto the substrate 'W' to protect the resist film in the liquid immersion lithography process. The protective film coating chamber 610 has a housing 611, a support plate 613, and a nozzle 413. The housing 611 has the shape of a cup having an open upper portion. The support plate 612 is positioned inside the housing 611 and supports the substrate 'W'. The support plate 612 is rotatably provided. The nozzle 613 feeds a protective liquid onto the substrate 'W' placed on the support plate 612 to form a protective film. The nozzle 613, which has a cylindrical tubular shape, feeds the photoresist to the center of the substrate 'W'. Alternatively, the nozzle 613 has a length corresponding to the diameter of the substrate 'W' and an exhaust port of the nozzle 613 may be provided in the form of a slit. In this case, the support plate 612 may be provided in a fixed state. The protecting liquid includes a foamable material. The protecting liquid may include a material having a lower affinity with a photoresist and water. For example, the protecting liquid may contain a fluorine-based solvent. The protective film coating chambers 610 feeds the protecting liquid to the central region of the substrate 'W' while rotating the substrate 'W' placed on the support plate 612.

The bake chamber 620 performs heat treatment with respect to the substrate 'W' having the protective film. The bake chamber 620 has the cooling plate 621 and the heating plate 622. The cooling plate 621 includes the cooling unit 623 such as cooling water or a thermoelectric element. The heating plate 622 includes the heating unit 624 such as a heating wire or a thermoelectric element. The heating plate 622 and the cooling plate 621 may be provided in one bake chamber 620. Alternatively, some of the bake chambers 620 may include only the heating plate 622, and others of the bake chambers 420 may include only the cooling plate 621.

The post-treatment module 602 has a cleaning chamber 660, a post-exposure bake chamber 670, and a carrying chamber 680. The cleaning chamber 660, the carrying chamber 680, and the post-exposure bake chamber 670 are sequentially disposed along the second direction 14. Accordingly, the cleaning chamber 660 and the post-exposure bake chamber 670 are spaced apart from each other in the second direction 14 while the carrying chamber 680 is interposed therebetween. A plurality of bake chambers 660 are provided and arranged in the third direction 16 such that the bake chambers 660 are stacked on each other. Alternatively, a plurality of cleaning chambers 660 may be provided in the first direction 12 and the third direction 16. A plurality of post-exposure bake chambers 670 are provided and arranged in the third direction 16 such that the post-exposure bake chambers 670 are stacked on each other. Alternatively, a plurality of post-exposure bake chambers 670 may be provided in the first direction 12 and the third direction 16.

The carrying chamber 680 is positioned in parallel to the second buffer 540 of the second buffer module 500 in the second direction 12, when viewed from above. The carrying chamber 680 has a substantially square or rectangular shape. A post-treatment robot 682 is positioned inside the carrying chamber 680. The post-treatment robot 682 carries the substrate 'W' among the cleaning chambers 660, the post-exposure bake chambers 670, the second cooling chamber 540 of the second buffer module 500, and the second buffer 730 of the interface module 700 to be described below. The post-treatment robot 682 provided in the post-treatment module 602 may have the same structure as that of the pre-treatment robot 632 provided in the pre-treatment module 601.

The cleaning chamber 660 cleans the substrate 'W' after the exposing process. The cleaning chamber 660 has a housing 661, a support plate 662, and a nozzle 663. The housing 661 has the shape of a cup having an open upper portion. The support plate 662 is positioned inside the housing 661 and supports the substrate 'W'. The support plate 662 is rotatably provided. The nozzle 663 feeds a cleaning liquid onto the substrate 'W' placed on the support plate 662. The cleaning liquid may include water such as deionized water. The cleaning chambers 660 feeds the cleaning liquid to the central region of the substrate 'W' while rotating the substrate 'W' placed on the support plate 662. Alternatively, while the substrate 'W' is being rotated, the nozzle 663 may linearly move or move while rotating, from the central region of the substrate 'W' to the edge region of the substrate 'W'.

The post-exposure bake chamber 670 heats the substrate 'W' subject to the exposing process using ultraviolet rays. The post-base process is to amplify acid generated in the photoresist through exposure by heating the substrate 'W', thereby completing the change of a property of the photoresist. The post-exposure bake chamber 670 has a heating plate 672. The heating plate 672 includes the heating unit 674 such as a heating wire or a thermoelectric element. The post-exposure bake chamber 670 may further include the cooling plate 671 provided therein. The cooling plate 671 includes the cooling unit 673 such as cooling water or a thermoelectric element. In addition, alternatively, a bake chamber having only the cooling plate 671 may be further provided.

As described above, the pre-treatment module 601 and the post-treatment module 602 are provided to be completely separated from each other, in the pre/post-exposure treatment module 600. In addition, the carrying chamber 630 of the pre-treatment module 601 and the carrying chamber 680 of the post-treatment module 602 may be provided in equal size, and may be provided to be completely overlapped with each other when viewed from above. In addition, the protective film coating chamber 610 and the cleaning chamber 620 may be provided in an equal size to be completely overlapped with each other when viewed from above. In addition, the bake chamber 620 and the post-exposure bake chamber 670 may be provided in equal size and may be provided to be completely overlapped with each other when viewed from above.

The interface module 700 transfers the substrate 'W' between the pre/post-exposure treatment module 600 and an exposure apparatus 900. The interface module 700 has a frame 710, a first buffer 720, a second buffer 730, and an interface robot 740. The first buffer 720, the second buffer 730, and the interface robot 740 are positioned in the frame 710. The first buffer 720 and the second buffer 730 are spaced apart from each other by a specific distance, and are disposed to be stacked on each other. The first buffer 720 is disposed higher than the second buffer 730. The first buffer 720 is positioned at a height corresponding to the pre-treatment module 601, and the second buffer 730 is positioned at a height corresponding to the post-treatment module 602. When viewed from above, the first buffer 720 is aligned in line with the carrying chamber 630 of the pre-treatment module 601 in the first direction 12, and the second buffer 730 is aligned in line with the carrying chamber 630 of the post-treatment module 602 in the first direction 12.

The interface robot 740 is positioned to be spaced apart from the first buffer 720 and the second buffer 730 in the second direction 14. The interface robot 740 transports the substrate 'W' among the first buffer 720, the second buffer 730, and the exposure apparatus 900. The interface robot 740 has a structure substantially similar to that of the second buffer robot 560.

The first buffer 720 temporarily stores the substrate 'W', which is subject to the process in the pre-treatment module 601 before the substrate 'W' is moved to the exposure apparatus 900. In addition, the second buffer 730 temporarily stores the substrates 'W', which are completely subject to a process in the exposure apparatus 900, before the substrate 'W' is moved to the post-treatment module 602. The first buffer 720 has a housing 721 and a plurality of supports 722. The supports 722 are disposed inside the housing 721, and are spaced apart from each other in the third direction 16. One substrate 'W' is placed on each of the supports 722. The housing 721 has openings (not illustrated) in directions of providing the interface robot 740 and the pre-treatment robot 632 such that the interface robot 740 and the pre-treatment robot 632 introduce or withdraw the substrate 'W' into or out of the support 722 in the housing 721. The second buffer 730 has a structure substantially similar to that of the first buffer 720. However, the housing 721 of the second buffer 730 has an opening (not illustrated) in the direction of providing the interface robot 740 and in the direction of providing the post-processing robot 682. The interface module may include only buffers and a robot as described above without providing a chamber to perform a specific process with respect to the substrate.

According to an embodiment of the inventive concept, the bottom edge part of the substrate may be easily cleaned.

According to an embodiment of the inventive concept, the edge nozzle may be easily fixed to the setting position.

According to an embodiment of the inventive concept, the interference with the edge nozzle may be prevented in the process of attaching or detaching the treating bowl.

The technical problems to be solved by the inventive concept are not limited to the aforementioned problems, and any other technical problems not mentioned herein will be clearly understood from the following description by those skilled in the art to which the inventive concept pertains.

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. The written embodiment describes the best state for implementing the technical spirit of the inventive concept, and various changes required in the detailed application fields and purposes of the inventive concept can be made. Furthermore, it should be construed that the attached claims include other embodiments.

What is claimed is:

1. An apparatus for treating a substrate, the apparatus comprising:
    a substrate support member configured to seat a substrate on the substrate support member;
    a treating bowl surrounding the substrate support member;
    a base plate configured to face a bottom surface of the substrate seated on the substrate support member; and
    an edge nozzle member mounted on the base plate and configured to spray a treating liquid to a bottom edge part of the substrate seated on the substrate support member,
    wherein the edge nozzle member includes:
    a main body mounted on the base plate, the main body having a bottom surface in contact with the base plate, an outer flat top surface, and a slide surface that is inclined with respect to the bottom surface;
    a nozzle arm having an inner flat bottom surface and a magnetic substrate, the nozzle arm configured to mount an edge nozzle on the nozzle arm and configured to slidably move on the slide surface of the main body; and
    a fixing member arranged at the outer flat top surface of the main body, the fixing member having a permanent magnet and configured to maintain the nozzle arm at a setting position on the main body,
    wherein when the nozzle arm is in the setting position, the inner flat bottom surface of the nozzle arm is fixed to the outer flat top surface of the main body by a magnetic force exerted by the permanent magnet of the fixing member.

2. The apparatus of claim 1, wherein the main body includes:
    a guide hole such that the nozzle arm slidably moves.

3. The apparatus of claim 2, wherein the nozzle arm includes a guide pin inserted into the guide hole and a marking part to determine the setting position.

4. The apparatus of claim 2, wherein the nozzle arm is slidably inserted into the slide surface of the main body after moved upward while rotating a predetermined angle, when the treating bowl is being extracted, and
    wherein the nozzle arm is moved to the setting position appropriate to a process after the nozzle arm is exposed by sliding when the process is performed.

5. The apparatus of claim 4, wherein the treating bowl includes:
    an outer cup mounted to surround the substrate support member and configured to detach from a lower portion of the apparatus; and
    an inner cup mounted to surround a lower region of a substrate placed on the substrate support member and configured to detach from the lower portion of the apparatus,
    wherein the inner cup includes a nozzle groove to position the edge nozzle of the nozzle arm, and
    wherein the setting position is a position at which the edge nozzle is inserted into the nozzle groove.

6. An apparatus for treating a substrate, the apparatus comprising:
    a treating bowl to surround a substrate support member;
    a base plate provided to face a bottom surface of the substrate seated on the substrate support member; and
    an edge nozzle member mounted on the base plate to spray a treating liquid to a bottom edge part of the substrate seated on the substrate support member,
    wherein the edge nozzle member includes:
    a nozzle arm including a magnetic substrate,
    a main body to which an edge nozzle slides so as to detach the treating bowl from a lower portion of the apparatus without interference with the edge nozzle member, the main body including a bottom surface in contact with the base plate, an outer flat top surface with respect to the bottom surface, and a slide surface that is inclined with respect to the bottom surface and upon which the edge nozzle slides, and
    a fixing member arranged at the outer flat top surface of the main body, the fixing member having a permanent magnet and configured to maintain the nozzle arm at a setting position on the main body.

7. The apparatus of claim 6, wherein
    the nozzle arm is configured to mount an edge nozzle on the nozzle arm to slidably move on the main body; and
    wherein the main body includes a guide hole such that the nozzle arm slidably moves,
    wherein the nozzle arm is retracted to an inner position radially inward of an inner circumferential surface of the treating bowl when the treating bowl is detached from a lower portion of the apparatus.

8. The apparatus of claim 7, wherein the nozzle arm further includes a guide pin inserted into the guide hole and a marking part to determine the setting position.

9. The apparatus of claim 1, wherein the nozzle arm includes a line corresponding to a marking part, the line position matched to an end of the main body when the nozzle arm is at the setting position.

10. The apparatus of claim 9, wherein the line is one of an intaglio pattern or an embossed pattern.

11. The apparatus of claim 7, wherein the nozzle arm includes a line corresponding to a marking part, the line position matched to an end of the main body when the nozzle arm is at a setting position.

12. The apparatus of claim 11, wherein the line is one of an intaglio pattern or an embossed pattern.

* * * * *